(12) United States Patent
Miglioli et al.

(10) Patent No.: US 6,512,454 B2
(45) Date of Patent: Jan. 28, 2003

(54) TAMPER RESISTANT ENCLOSURE FOR AN ELECTRONIC DEVICE AND ELECTRICAL ASSEMBLY UTILIZING SAME

(75) Inventors: Alberto Miglioli, Gorle (IT); Virginio Ratti, Nibionno (IT); Emilio Riva, Como (IT); Luigi Villa, Vimercate (IT)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/859,251

(22) Filed: May 17, 2001

(65) Prior Publication Data

US 2002/0014962 A1 Feb. 7, 2002

(30) Foreign Application Priority Data

May 24, 2000 (GB) .............................................. 0012478

(51) Int. Cl.⁷ ............................................... G08B 13/00
(52) U.S. Cl. .................... 340/541; 340/571; 340/573.1; 340/652
(58) Field of Search ................................ 340/541, 652, 340/571, 573.1

(56) References Cited

U.S. PATENT DOCUMENTS

| | | | |
|---|---|---|---|
| 4,811,288 A | * | 3/1989 | Kleijne et al. ............... 340/652 |
| 5,621,387 A | * | 4/1997 | Phillips et al. ............... 340/568 |
| 5,790,670 A | | 8/1998 | Bramlett |
| 5,858,500 A | * | 1/1999 | MacPherson ................ 428/68 |
| 5,861,662 A | * | 1/1999 | Candelore ................... 257/679 |

* cited by examiner

Primary Examiner—Jeffery Hofsass
Assistant Examiner—Hung Nguyen
(74) Attorney, Agent, or Firm—Lawrence R. Fraley

(57) ABSTRACT

A tamper resistant enclosure for protecting an electronic device containing sensitive information (e.g. an electronic cryptographic card), is provided. The enclosure includes an external cover and an internal cover. Four screws (one at each corner) secure the internal cover to the device and the external cover by means of standoffs. A washer is interposed between the device and the standoff. The device has a dielectric substrate with a metal pad around each hole for ensuring the electrical connection to ground through the washer, the standoff and the conductive body of the external cover. When one of the screws is at least partially removed and the internal cover is moved, the circuit is interrupted and the system assumes that a tampering is being attempted. The circuit is designed to give an alarm and/or destroy all the sensitive information contained in the protected electronic device.

12 Claims, 3 Drawing Sheets

TAMPER RESISTANT ENCLOSURE FOR AN ELECTRONIC DEVICE AND ELECTRICAL ASSEMBLY UTILIZING SAME

FIELD OF INVENTION

The present invention relates to the protection of electronic devices such as printed circuit boards and cards from unauthorized intrusion. More particularly, the present invention relates to an improved intrusion detection structure for use with such devices.

BACKGROUND OF THE INVENTION

It is a usual requirement for many computer applications to protect data from unwanted access by an unauthorized user. Many software protection systems are known in the art to allow only selected users to access said protected data, with the use of a password or other identification methods. Communication of data on a network is protected from undesired detection by means of encryption methods. Passwords, encryption keys and other sensitive data are usually stored in memory components in the computer systems and need to be protected even more carefully from unwanted inspection. Software control and protection methods may be not enough to stop an experienced person from bypassing these protections and tampering with the computer hardware, e.g. by direct interrogation of memory components such as integrated circuit memory.

A possible protection from the above physical attacks is to provide some kind of detecting means which detects an attempted intrusion within a protected sensitive area and reacts by giving an alarm or even by destroying any sensitive information to avoid the loss of secrecy.

U.S. Pat. No. 5,790,670 discloses an intrusion detection mechanism having a metallic cover for protecting an encryption circuitry and a memory in which the encryption key is stored. The metallic cover has a top and a bottom side which are secured together by a screw. The screw merely functions to cause a switch arm to depress a switch button when the mechanism is in the desired, assembly mode. When the security screw is rotated, a circuit is activated (by opening of the button), the attempt to open the cover is detected and a destruct circuit is enabled which causes the memory to be erased. A drawback of this method is that the electromechanical switch utilized is subject to hot and cold temperatures, dampness and other deteriorating environmental conditions which can adversely affect the switch's level of performance, especially after prolonged exposure to such conditions. Furthermore, a failure of the circuit itself may be caused by oxidation of the circuitry at various portions thereof as a result of such prolonged exposure.

For the reasons above, an improved and relatively simple mechanism for detecting the attempt to open the protecting cover of a protective enclosure would be desirable. It is an object of the present invention to alleviate the above drawbacks of the prior art.

DISCLOSURE OF THE INVENTION

According to one aspect of the present invention, there is provided a tamper resistant enclosure for protecting an electronic device comprising a first cover on a first side of said electronic device, a second cover on the opposite side of said electronic device, a plurality of fixing elements passing through the first cover and the device and securing the first cover to the second cover while forming a circuit, and detecting means for detecting the removal of at least one of said fixing elements (e.g., screws).

According to another aspect of the invention, there is provided an electrical assembly which includes an electronic device including an electrical circuit having sensitive information as part thereof, a tamper resistant enclosure, the electronic device being positioned within the enclosure, the enclosure including a first cover for being positioned substantially on a first side of the electronic device, a second cover for being positioned substantially on the opposite side of the electronic device from the first side, a plurality of fixing components passing through the first cover for securing the first cover to the second cover, the fixing elements adapted for passing through the electronic device and forming a part of the electrical circuit of the electronic device when the first cover is secured to the second cover, and a detector for detecting the interruption of the electrical circuit caused by at least the partial removal of at least one of the fixing elements.

BRIEF DESCRIPTION OF THE DRAWINGS

Various embodiments of the invention will now be described in detail by way of examples, with reference to accompanying figures, where.

DESCRIPTION OF THE PREFERRED EMBODIMENTS

Figure 1A:
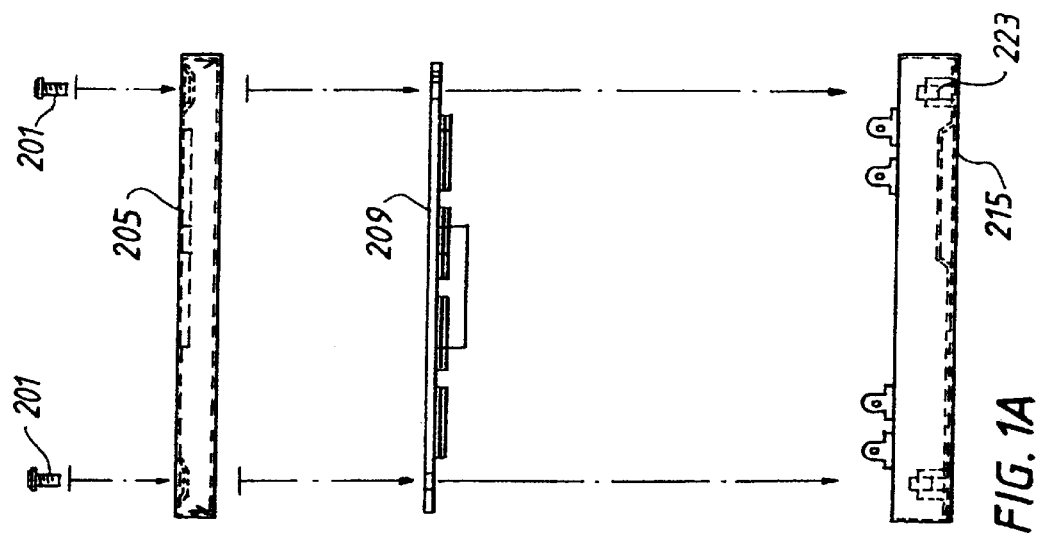
FIGS. 1 and 1A show prospective and elevational views of a tamper resistant card enclosure according to a preferred embodiment of the present invention. Note that FIG. 1A is inverted with respect to FIG. 1.
Figure 1:
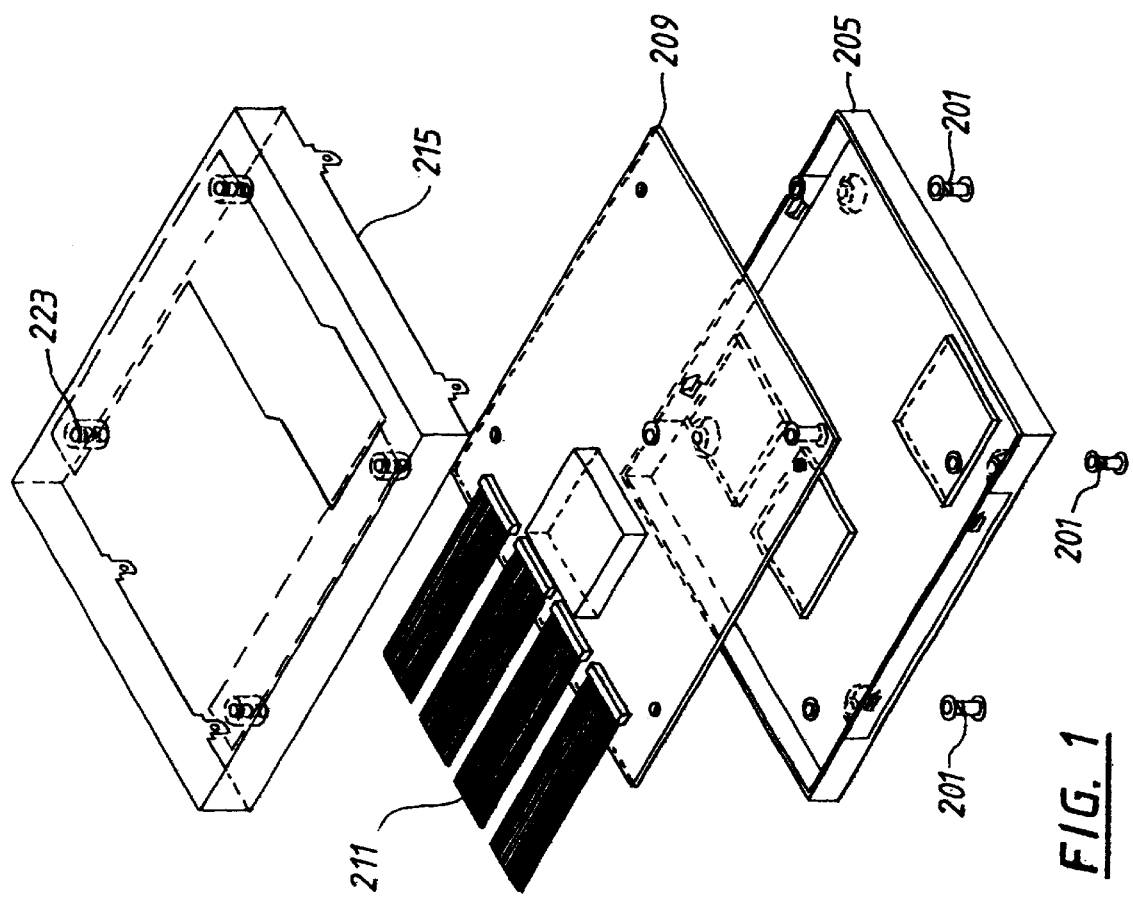

With reference to FIG. 1 and FIG. 1A, a tamper resistant enclosure according to a preferred embodiment of the present invention is shown. An electronic device 209 containing sensitive information (e.g. an electronic cryptographic card), is protected by a metal enclosure comprising an external cover 215 and an internal cover 205. The bottom side of the external cover has four standoffs 223 in proximity of the four corners. Device 209 has four holes corresponding to the four standoffs 223. Internal cover 205 can be secured to external cover 215 by means of four screws 201 which pass through the holes in device 209 and fit into standoffs 223. (Again note that FIG. 1A is inverted with respect to FIG. 1.) Flexible cables 211 provide the electrical connection between device 209 and the outside world.

Figure 2:
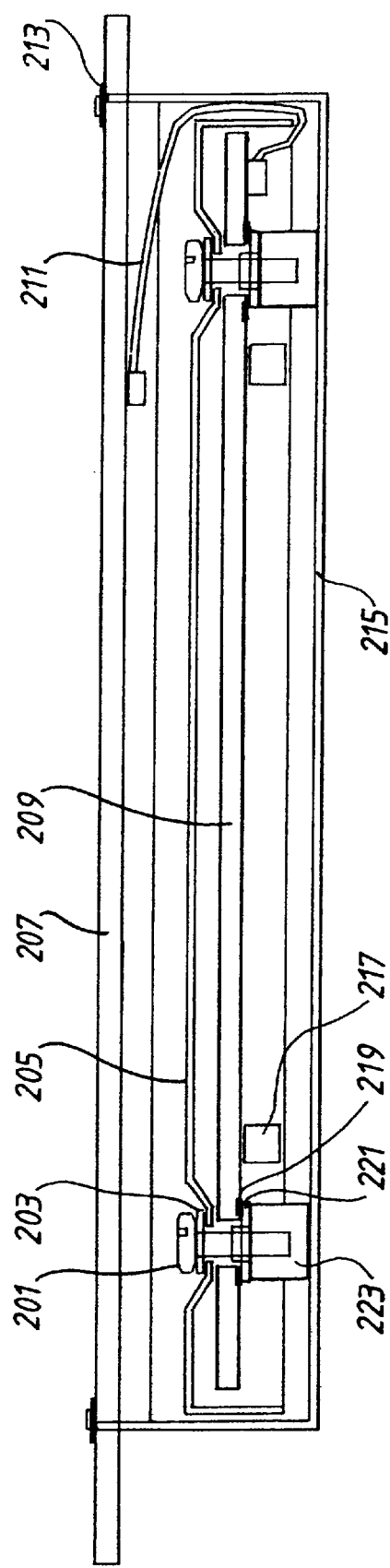
FIG. 2 shows an enlarged, side view of the enclosure of FIGS. 1 and 1A.
Figure 3:
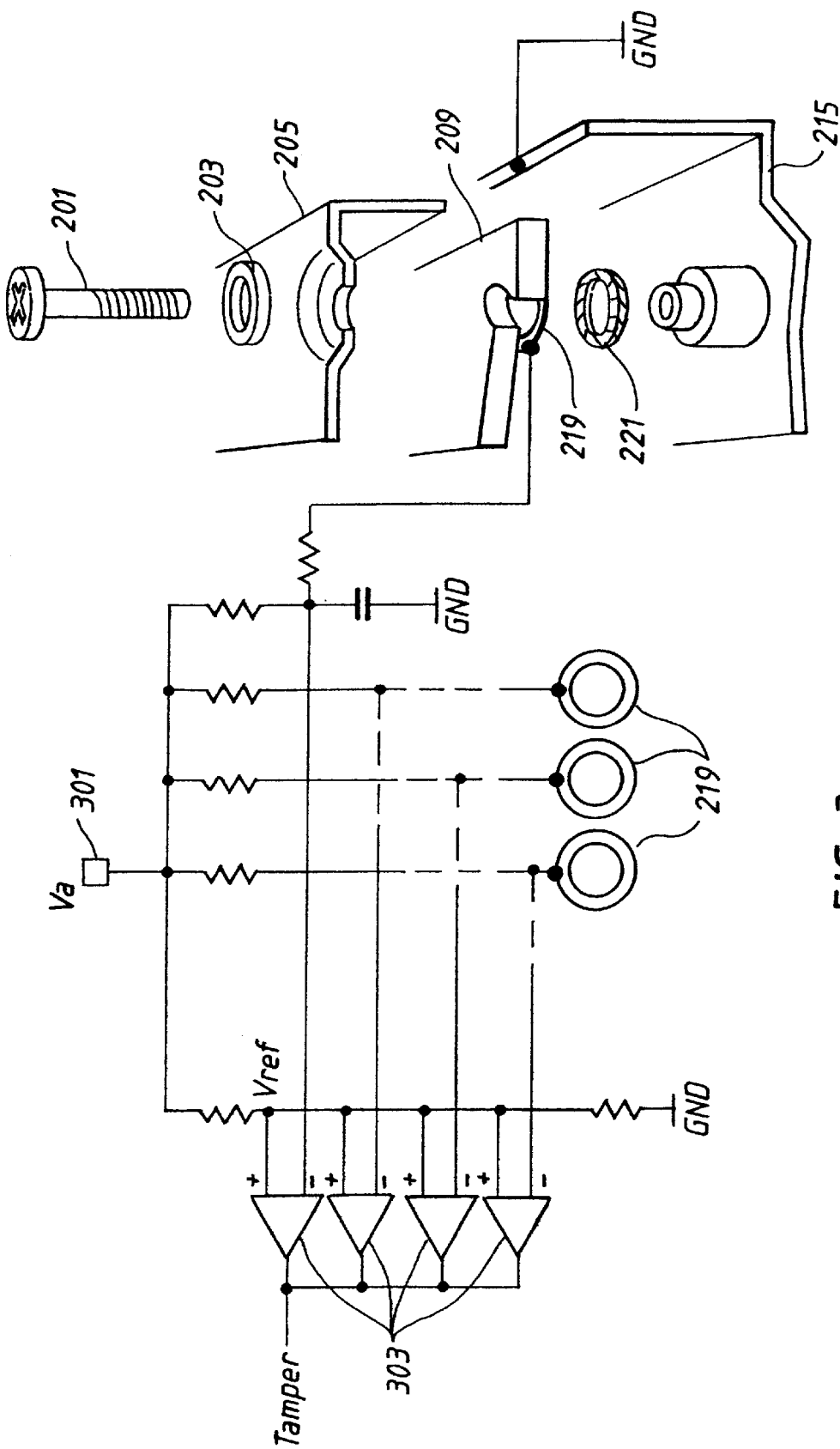
FIG. 3 shows the electrical circuit used in a preferred embodiment of the present invention, in combination with associated elements of the invention's enclosure.

Looking at FIG. 2, which, like FIG. 1A, is inverted relative to FIG. 1, the same enclosure is shown with all the parts assembled together. As mentioned above, screws 201 secure internal cover 205 to device 209 and external cover 215 by means of standoffs 223. Belville washer 203 is interposed between the head of screw 201 and the top side of device 209, while star washer 221 is interposed between device 209 and standoff 223. Device 209 comprises a dielectric substrate (e.g., a printed circuit board or card) with a metal pad 219 (see also FIG. 3) around each hole for ensuring the electrical connection to ground through star washer 221, standoff 223 and the body of external cover 215. As is understood, the conductive screw forms part of the circuitry, along with star washer 221, pad 219, standoff 223 and cover 215, the latter coupled to ground (FIG. 3). Any break in the ground connection will trigger the circuit's alarm into action. According to a preferred embodiment of the present invention, the tamper resistant enclosure can be secured to a card (e.g. a mother board, or a standard PCI mother card) 207. Communications with device 209 are provided by cables 211, while external cover 215 is soldered to ground through tabs 213.

Figure 2A:
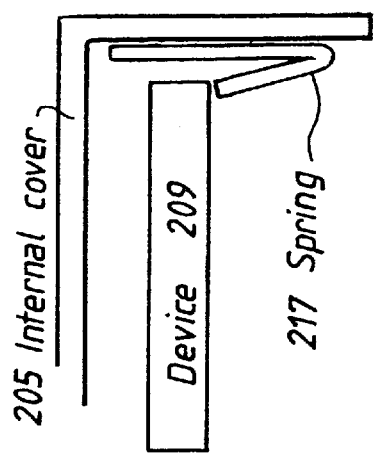
FIG. 2A shows a further enlarged, partial view of the enclosure.

When one of the screws 201 is at least partially removed and internal cover 205 is also at least partially removed, device 209 is lifted together with internal cover 205, with assist by spring 217 (FIG. 2A). The circuit described above (metal pad 219, star washer 221, standoff 223 and external cover 215) is interrupted and the system assumes that a tampering is being attempted. The circuit is designed to react by giving an alarm and/or by destroying all the sensitive information contained in the protected electronic device 209. According to a preferred embodiment of the present invention, the detected intrusion attempt causes an erasing circuit to be activated and the memory containing sensitive information to be erased.

FIG. 3 shows the tamper detection circuit according to a preferred embodiment of the present invention. A voltage Va is constantly supplied at point 301. The supply can be provided either by a battery or by a system power supply. Four comparators 303 monitor the circuit. Each comparator 303 has one input (+) fixed at a reference voltage (Vref) and a second input (−) connected to one of the circular pads 219. In normal operational conditions, when the package is closed and circular pads 219 are forced to a low level (ground) by means of the above mentioned circuit (star washer 221, standoff 223 and external cover 215), the comparators' output is inactive (i.e. no tamper is detected). If one of the screws 201 is removed and internal cover 205 (together with device 209) is lifted, the corresponding circular pad(s) 219 lose the connection to ground and the negative (−) input of the corresponding comparator goes to a high level, causing the comparator to trigger the erasing circuit. Another event which can cause the activation of the comparator is the removing of the battery or the interruption of the power supply. The reaction in this case is the same as described above and the sensitive information is destroyed because the security of the system cannot be guaranteed any longer.

What is claimed is:

1. A tamper resistant enclosure for protecting an electronic device positioned therein and including an electrical circuit, said enclosure comprising:

a first cover for being positioned substantially on a first side of said electronic device;

a second cover for being positioned substantially on the opposite side of said electronic device from said first side;

a plurality of fixing components passing through said first cover for securing said first cover to said second cover, said fixing components adapted for passing through said electronic device and forming a part of said electrical circuit of said electronic device when said first cover is secured to said second cover; and a detector for detecting the interruption of said electrical circuit caused by at least the partial removal of at least one of said fixing components.

2. The tamper resistant enclosure of claim 1 wherein said enclosure includes at least four corner portions, each of said fixing components comprising a screw positioned substantially at a respective one of said corner portions.

3. The tamper resistant enclosure of claim 2 wherein said electronic device positioned in said enclosure includes a metal pad, said electrical circuit including at least one of said screws, said metal pad and an electrically conductive washer.

4. The tamper resistant enclosure of claim 3 wherein said washer is a star washer.

5. The tamper resistant enclosure of claim 1 wherein said enclosure is adapted for being positioned on a printed circuit card or board.

6. An electrical assembly comprising:

an electronic device including an electrical circuit having sensitive information as part thereof;

a tamper resistant enclosure, said electronic device being positioned within said enclosure, said enclosure including a first cover for being positioned substantially on a first side of said electronic device, a second cover for being positioned substantially on the opposite side of said electronic device from said first side, a plurality of fixing components passing through said first cover for securing said first cover to said second cover, said fixing components adapted for passing through said electronic device and forming a part of said electrical circuit of said electronic device when said first cover is secured to said second cover and a detector for detecting the interruption of said electrical circuit caused by at least the partial removal of at least one of said fixing components.

7. The electrical assembly of claim 6 wherein said enclosure includes at least four corner portions, each of said fixing components comprising a screw positioned substantially at a respective one of said corner portions.

8. The electrical assembly of claim 7 wherein said electronic device positioned in said enclosure includes a metal pad, said electrical circuit including at least one of said screws, said metal pad and an electrically conductive washer.

9. The electrical assembly of claim 8 wherein said washer is a star washer.

10. The electrical assembly of claim 6 wherein said electrical circuit includes a security circuit portion for destroying said sensitive information when said detector detects said electrical circuit interruption.

11. The electrical assembly of claim 6 further including a printed circuit card or board, said tamper resistant enclosure positioned on said printed circuit card or board.

12. The electrical assembly of claim 11 wherein said electrical circuit is electrically coupled to said printed circuit card or board.

* * * * *